US008394197B2

(12) United States Patent
Tudhope et al.

(10) Patent No.: US 8,394,197 B2
(45) Date of Patent: Mar. 12, 2013

(54) CORROSION-RESISTANT INTERNAL COATING METHOD USING A GERMANIUM-CONTAINING PRECURSOR AND HOLLOW CATHODE TECHNIQUES

(75) Inventors: Andrew W. Tudhope, Danville, CA (US); Thomas B. Casserly, San Ramon, CA (US); Karthik Boinapally, Fremont, CA (US); Deepak Upadhyaya, Fremont, CA (US); William J. Boardman, Danville, CA (US)

(73) Assignee: Sub-One Technology, Inc., Pleasanton, CA (US)

( * ) Notice: Subject to any disclaimer, the term of this patent is extended or adjusted under 35 U.S.C. 154(b) by 1055 days.

(21) Appl. No.: 12/218,119

(22) Filed: Jul. 11, 2008

(65) Prior Publication Data

US 2009/0017230 A1 Jan. 15, 2009

Related U.S. Application Data

(60) Provisional application No. 60/959,361, filed on Jul. 13, 2007.

(51) Int. Cl.
*C30B 28/14* (2006.01)

(52) U.S. Cl. ............... 117/92; 117/84; 117/85; 117/86; 117/88; 117/89; 117/90; 117/91; 117/93; 117/94; 117/95; 117/97; 117/99; 117/100; 117/102; 117/103; 117/104; 117/105; 117/106; 117/108; 117/109; 117/200; 117/201; 118/715; 118/716; 118/718; 118/720; 118/723 R; 427/230; 427/532; 427/533; 427/534; 427/535; 427/536; 427/537; 427/561; 427/562; 427/563; 427/564; 427/569; 427/570; 427/571; 427/572; 427/573; 427/574; 427/575; 427/576; 427/577; 427/578; 427/579; 427/580

(58) Field of Classification Search .............. 117/84–86, 117/88–95, 97, 99–100, 102–106, 108–109, 117/200–201, 949; 118/715–716, 718, 720, 118/723, 733; 427/230, 532–537, 561–564, 427/569–580
See application file for complete search history.

(56) References Cited

U.S. PATENT DOCUMENTS

| 5,273,791 | A | * | 12/1993 | Imanishi et al. | ............... 427/577 |
| 5,965,217 | A | * | 10/1999 | Sugiyama et al. | ............ 427/577 |
| 6,086,796 | A | * | 7/2000 | Brown et al. | ................. 264/1.33 |
| 6,755,945 | B2 | * | 6/2004 | Yasar et al. | ................. 204/192.3 |
| 7,629,031 | B2 | * | 12/2009 | Dornfest et al. | ............. 427/535 |
| 2006/0196419 | A1 | * | 9/2006 | Tudhope et al. | ............. 118/715 |
| 2006/0198965 | A1 | * | 9/2006 | Tudhope et al. | ............. 427/569 |

OTHER PUBLICATIONS

Maciel, H.S., et al., "Studies of a Hollow Cathode Discharge Using Mass Spectrometry and Electrostatic Probe Techniques," 12$^{th}$ International Congress on Plasma Physics, Oct. 25-29, 2004, Nice, France.

* cited by examiner

*Primary Examiner* — Michael Kornakov
*Assistant Examiner* — Kenneth A Bratland, Jr.
(74) *Attorney, Agent, or Firm* — Schneck & Schneck; David M. Schneck

(57) ABSTRACT

Enhanced corrosion resistance is achieved in a coating by using a germanium-containing precursor and hollow cathode techniques to form a first layer directly on the surface of a workpiece, prior to forming an outer layer, such as a layer of diamond-like carbon (DLC). The use of a germanium or germanium-carbide precursor reduces film stress and enables an increase in the thickness of the subsequently formed DLC. Germanium incorporation also reduces the porosity of the layer. In one embodiment, a cap layer containing germanium is added after the DLC in order to further reduce the susceptibility of the coating to chemical penetration from the top.

14 Claims, 8 Drawing Sheets

CORROSION-RESISTANT INTERNAL COATING METHOD USING A GERMANIUM-CONTAINING PRECURSOR AND HOLLOW CATHODE TECHNIQUES

CROSS REFERENCE TO RELATED APPLICATION

This application claims priority from provisional application No. 60/959,361, filed Jul. 13, 2007.

TECHNICAL FIELD

The invention relates generally to chemical vapor deposition systems and more particularly to promoting corrosion resistance for internal coatings of a workpiece.

BACKGROUND ART

The corrosion of industrial piping and other components such as valves and pumps is a major problem in some industries. The oil industry, in particular, faces severely corrosive environments, with corrosive gasses and liquids such as $H_2S$ (hydrogen sulfide) at elevated temperatures and pressures. Additionally, these conditions form severe wear and erosion environments. One solution to these issues is to coat a lower grade base material with a high quality coating material having the desired high corrosion and wear-resistant properties. Typically, these types of properties will be found in metal, ceramic and particularly diamond-like carbon coatings.

Stainless steel is one example of a metal alloy that is sometimes coated to improve corrosion resistance. Other expensive specialty alloys, such as Hastelloy and Inconel (both of which are federally registered trademarks of Huntington Alloys Corporation), are commonly used for exhaust piping in not only the semiconductor industry, but in chemical processing industries in general. These alloys exhibit high temperature strength and corrosion resistance. Again, a less expensive base material can be used if a suitable surface coating is applied to the interior surface that is to be exposed to the corrosive environment.

In the application of a corrosion-resistant coating to a pipe or other workpiece, adhesion of the coating material to the workpiece must be considered. For a particular coating material, some base materials more readily adhere to the coating material than others. For example, a coating material of diamond-like carbon (DLC) adheres more readily to smooth stainless steel than to either nickel or a rough surface such as carbon steel. Chemical vapor deposition (CVD) is used in numerous applications in which adhesion and corrosion resistance are critical performance parameters. Historically, adhesion of a coating bonded to a substrate or other workpiece is promoted by careful selection of the activation energy for bonding, selection of temperature, and the application of surface area preparations. Plasma enhanced CVD (PECVD) enables depositing films at reduced temperatures, but the energy delivered by plasma typically is not sufficient to provide the desired level of adhesion.

U.S. Pat. No. 5,965,217 to Sugiyama et al. describes forming two intermediate films prior to forming the DLC film. The first intermediate film is selected for its ability to adhere to the workpiece itself, while the second intermediate film is selected for its ability to adhere readily to the subsequently formed DLC film. The first intermediate film is provided by sputtering or resistance heating evaporation using an auxiliary electrode formed of the selected material. The patent states that the first intermediate film may be titanium, chromium, aluminum, or a metal silicide film such as a titanium-silicon alloy, a carbon-silicon alloy, a titanium-germanium alloy or a chromium-germanium alloy. In comparison to the process for forming the first intermediate film, the second intermediate film is formed by supplying a gas which contains silicon or germanium into a vacuum vessel to produce a plasma. The purpose of the two intermediate films is to promote adhesion, while the purpose of the DLC layer is to promote corrosion resistance. Nevertheless, the concern is that if the workpiece is intended for use in contact with corrosive fluids, a pinhole through the DLC will allow the corrosive flow to reach the intermediate layers, potentially resulting in an undercut of material.

The coating process for steel and other conductive workpieces continues to be an issue, particularly if the workpiece is intended for regular contact with corrosive fluids. Techniques used in other industries are of interest, but do not provide a complete solution. U.S. Pat. No. 6,086,796 to Brown et al. describes techniques for coating a recording medium, such as a phase-change optical medium for use with laser optics. The lifetime of the phase-change recording medium can be extended by forming DLC on a germanium-containing adhesion-promoting interlayer. The patent states that the DLC may be formed using ion beam deposition, but other techniques may be employed. The focus of the interlayer is to promote adhesion, rather than to retard corrosion, since the recording medium is not exposed to aggressive environment or rough substrates. Additionally, the deposition rate for ion beam deposition may not be suitable for coating workpieces such as pipes. "Example 1" in Brown et al. describes deposition of a DLC layer having a thickness of 150 Angstroms in 5.5 minutes.

While prior art approaches operate well in many applications for coating a workpiece, further advances are sought.

SUMMARY OF THE INVENTION

In accordance with the invention, corrosion resistance is promoted by using a germanium-containing precursor and hollow cathode techniques to form a first layer directly on the surface of the workpiece, prior to forming a DLC layer. It has been determined that using a germanium or germanium-hydrocarbon precursor and the incorporation of germanium or germanium carbide into the coating reduces corrosive attack on the coating. Additionally, the stress factor is reduced and enables an increase in the thickness of the subsequently formed DLC. Thus, the germanium or germanium-carbide that is incorporated into the coating reduces porosity of the DLC.

It has also been determined that the use of tetramethylgermane is the preferred precursor. A germanium hydrocarbon precursor such as tetramethylgermane results in germanium carbide incorporation into the coating and some hydrogen, while a precursor such as germane ($GeH_4$) results in germanium and hydrogen incorporation. Germanium or germanium carbide incorporation into the adhesion layer of the coating prevents chemical undercut of the coating, which could otherwise result from pinholes or other damage to the top layers of the coating. Adhesion layer chemistry is typically chosen to provide a strong bond to the substrate. In the case of a steel substrate, a silicon or metal-containing chemistry is typically used. Germanium or germanium carbide can be added to other adhesion layer chemistries (such as silicon or silicon carbide) and reduces corrosive attack. Optionally for certain substrates, a pure germanium or germanium carbide adhesion layer can be used. Also for certain substrates, the PEB (Plasma Enhanced Bonding) process described below can be used to enhance adhesion, but this process is not necessary for the corrosion resistance benefit of germanium incorporation. In one embodiment, a cap layer containing germanium is added after the DLC in order to further reduce the susceptibility of the added films to chemical penetration from the top.

The various films are applied using a PECVD process that employs a high density hollow cathode plasma generated on the basis of the diameter of the workpiece and the internal pressure, so that high energy electrons reside within the workpiece, which is connected as a cathode. The resulting high density plasma in conjunction with DC pulsing enables the deposition of thick films at high deposition rates. The duty cycle of the power supply is adjusted on the basis of the length and the diameter of the internal passage-way through the workpiece in order to allow plasma replenishment for long internal surfaces. From an environmental viewpoint, the process is favorable since the resulting workpiece is more resistant to corrosion and, thus, has a longer useful life.

DETAILED DESCRIPTION

Figure 1:
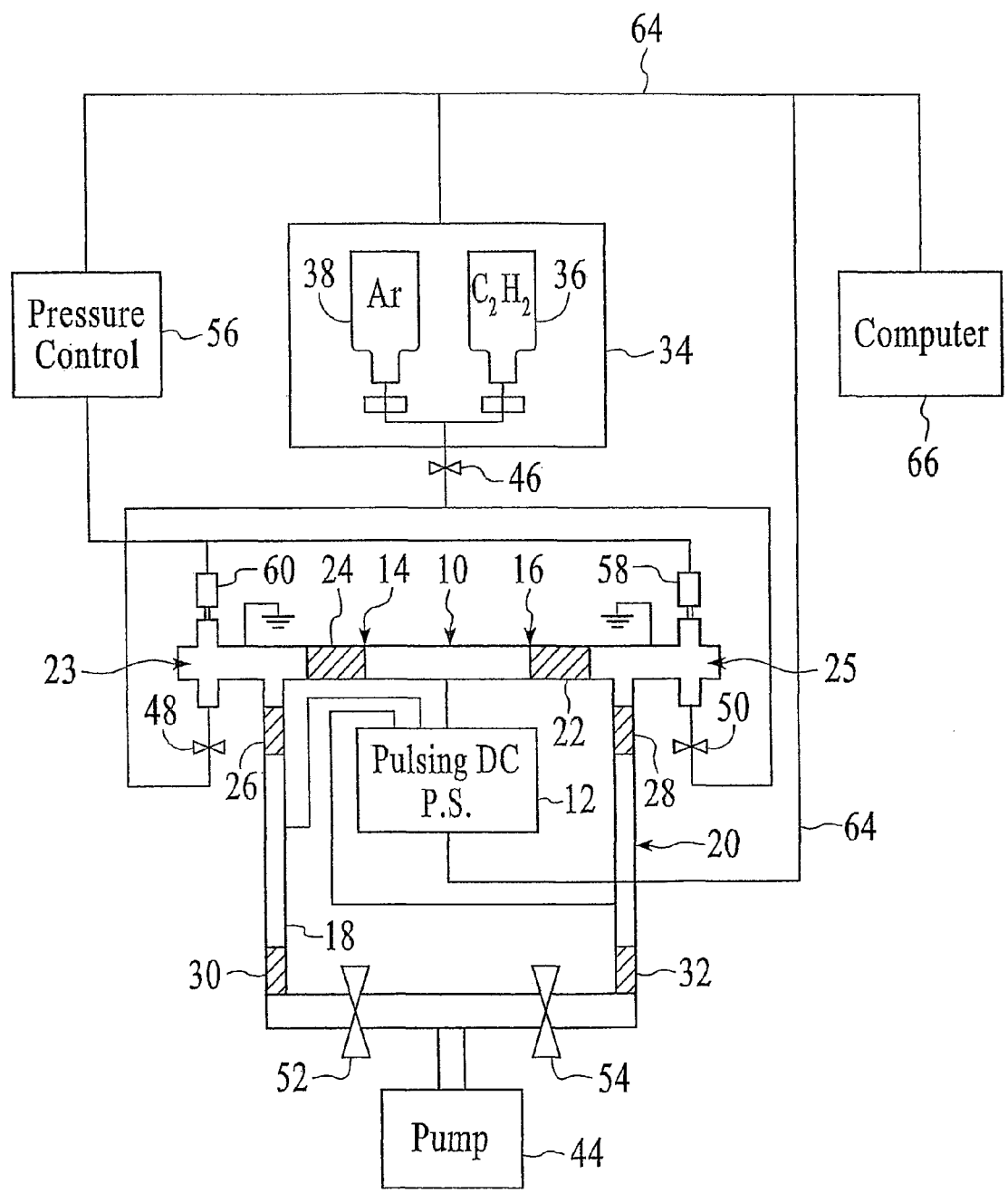
FIG. 1 is a functional view of a coating apparatus in accordance with one embodiment of the invention.

With reference to FIG. 1, a conductive pipe or "workpiece" 10 is connected to a pulsed DC power supply 12, which applies a pulsed negative bias. This negative bias is used to (a) create a plasma between a cathode and an anode, (b) draw an ionized reactive gas to the surfaces to be coated, (c) allow ion bombardment during PEB processing to improve coating properties such as adhesion and corrosion resistance, and (d) allow control of uniformity by adjusting the duty cycle so as to permit replenishment of a source gas and depletion of surface charges resulting from the coating process during the "off" portion of the cycle. Here, the workpiece 10 functions as a cathode while anodes 18 and 20 are connected to the positive side of the pulsed DC supply. Gas reservoirs 23 and 25 are coupled to each end of the workpiece. Only two gas reservoirs are shown, but typically more are involved in the PEB and subsequent coating steps that will be described below. Alternatively, the anodes 18 and 20 can be inserted inside the gas reservoirs and configured with inert gas purging to prevent coating of the anode in cases where the coating is an insulator, since this coating of the anodes would cause the anodes to "disappear" electrically.

Pressure sensors 58 and 60 are located at each gas reservoir 23 and 25, so that the pressure drop across the pipe 10 can be monitored and controlled. The anodes 18 and 20 are located near workpiece openings 14 and 16 and are physically and electrically isolated from the conductive workpiece and other functional subsystems by insulators 22, 24, 26, 28, 30 and 32. A gas supply subsystem 34 and pumping subsystem 44 are coupled to the gas reservoirs and the workpiece openings 14 and 16 via flow control valves 46, 48, 50, 52 and 54.

In FIG. 1, the workpiece 10 is shown as a single piece, but may be an assembly of tubes or pieces. The assembly preferably has all welding and assembly steps completed and should be leak tested prior to the coating process to be described below. The workpiece may be conductive piping that is connected to a system that includes the gas supply subsystem 34 and the pumping subsystem 44. A readily available non-toxic carbon containing gas, such as methane or acetylene, is provided by a first gas supply container 36. This gas is used to form a diamond-like carbon (DLC) coating on the inside of the workpiece. Argon (or other sputter gas) is provided from a second gas supply container 38 to allow plasma "pre-cleaning" of the pipe surface, and mixing of Ar and carbon-containing gas. The gas supply containers are also capable of providing a suitable material for forming an interfacial compound during PEB processing. This interfacial compound provides the improvements in adhesion and corrosion resistance. While not exhaustive, suitable materials include Ge, Si, C and potentially Sn.

A pressure controller 56 receives information from an optical probe 58 and a langmuir probe 60, which are placed such that the optical probe has a line-of-sight into the plasma and the langmuir probe contacts the plasma. The two probes sense plasma intensity and generate information indicative of the intensity level. This information is used by the controller to determine a proper setting for flow control valves 52 and 54. The setting may be such that the pressure inside the workpiece 10 establishes a condition in which the electron mean free path is related to the inner diameter of the workpiece, such that high energy electrons will oscillate between the cathode walls and increase ionizing collisions by the "hollow cathode" effect. Thus, a more intense plasma is generated within the workpiece. Since the electron mean free path increases as the pressure decreases, it is necessary to decrease pressure as the pipe diameter increases. For example, a one inch (25 millimeter) diameter gasline will generate a hollow cathode plasma at a pressure of approximately 200 mTorr, while a four inch (101.6 millimeter) diameter pump exhaust duct would generate a plasma at a pressure of approximately 50 mTorr. These are intended to be approximate values to show the general trend of lower pressure with larger diameter, but the pressure range can vary significantly from these values and still maintain a hollow cathode plasma. For additional information regarding the "hollow cathode effect" as used in this patent document, reference may be made to the periodical "Studies of a Hollow Cathode Discharge Using Mass Spectrometry and Electrostatic Probe Techniques," H. S. Maciel et al., $12^{th}$ *International Congress on Plasma Physics*, 2004, *Nice Proceedings ICPP*2004, 2004.

The pressure controller 56 is also used to monitor the pressure drop across the pipe and control and adjust it using pump throttle valves 52 and 54 or rapid response mass flow control valves 48 and 50. It is desirable to prevent too large a drop in pressure and flow velocity for small diameter (3.8 cm) and long (61 cm) pipes to ensure a uniform high density hollow cathode effect plasma down the length of the pipe during the "on" condition of the pulsed DC supply. On the other hand, during the "off" cycle of a DC pulsed plasma burst, when it is desirable to rapidly refill the pipe with reactant gas, the pressure drop and flow velocity can be increased.

It may also be desirable to change the duty cycle in different bursts. For example, a deposition burst is run at 100 kHz with a duty cycle of 55% "on," that is 4.5 microseconds off and 5.5 microseconds "on." A time period of 4.5 microseconds is not long enough to replenish the reactant gas throughout the length of a small diameter and long pipe, so this deposition burst should be run for a time period of approximately 10 microseconds. This is followed by a longer lower frequency burst, which shuts the high frequency DC pulsing off completely during the "off" duty cycle to allow the gas to be replenished through the pipe. For example, a 25 Hz burst with a 10% duty cycle will turn the high frequency pulsing on for 4 msec and shut it off for 36 msec. This "off" cycle should be increased as the diameter becomes smaller and the length longer, with approximately 30 milliseconds being applicable for a 3.8 cm diameter and 91 cm long pipe at 80 mTorr and 160 sccm of gas flow.

The degree of ionization or plasma intensity is important for the deposition technique to be effective, since it is only the ionized gas that is accelerated across the plasma sheath into the workpiece 10. The hollow cathode effect provides a more intense plasma than is otherwise available in DC or RF plasmas. This increase in intensity is available without the complications of other means of generating intense plasmas, such as magnets or microwave plasma sources. The optical and langmuir probes 58 and 60 are located at the anode end connections to monitor when the intense hollow cathode is properly generated.

Computer software control 66 is shown as being connected to the gas supply subsystem 34 and the pressure controller 56. In addition, the computer software control is able to generate and transmit control signals via an interface cable 64 to the DC pulsed power supply subsystem 12 for the purpose of governing operations.

When considering the flow rates and pressures required through a workpiece with a high aspect ratio (length/diameter), if the internal section is approximated to be a long circular tube with laminar flow, Poiseuille's equation can be used:

$$V = \frac{\pi r^4 \Delta P}{8 \eta l}$$

where V is the volumetric flow rate, r is the passageway radius, $\Delta P$ is the average pressure, l is the passageway length, $\eta$ is the viscosity. In the equation, r is raised to the fourth power and will cause a significant decrease in V. For example, a 3.8 cm diameter tube, having the same length as a 7.6 cm diameter tube, will have 16× less flow, all other factors being equal. $\Delta P = VR$, where R is the resistance to flow, $$R = \frac{8 \eta l}{\pi r^4}.$$

The pressure gradient $\Delta P$ must increase as R becomes larger to maintain the same flow.

For small diameter pipes, the plasma "off" time can be increased to refill the pipe or the pressure gradient can be increased to decrease the residence time, keeping in mind the negative effect too large a pressure gradient has on plasma uniformity. A combination of increased plasma "off" time and increased pressure gradient may also be implemented, being careful not to negatively affect the plasma uniformity with too large a pressure gradient.

The decrease in V and increase in pressure gradient with increasing aspect ratio (length/diameter) will have a significant effect on the uniformity of the deposition down the length of the workpiece. Since deposition rate is proportional to pressure and because the pressure becomes higher at the entrance of the workpiece with respect to the exit, the uniformity will become progressively worse with increasing length/diameter. Thus, it is desirable to have a low pressure drop $\Delta P$ across the pipe for good coating uniformity. On the other hand, if $\Delta P$ and thus the flow rate V become too low, the reactant gas will tend to deplete before it reaches the exit end of the pipe.

Figure 2:
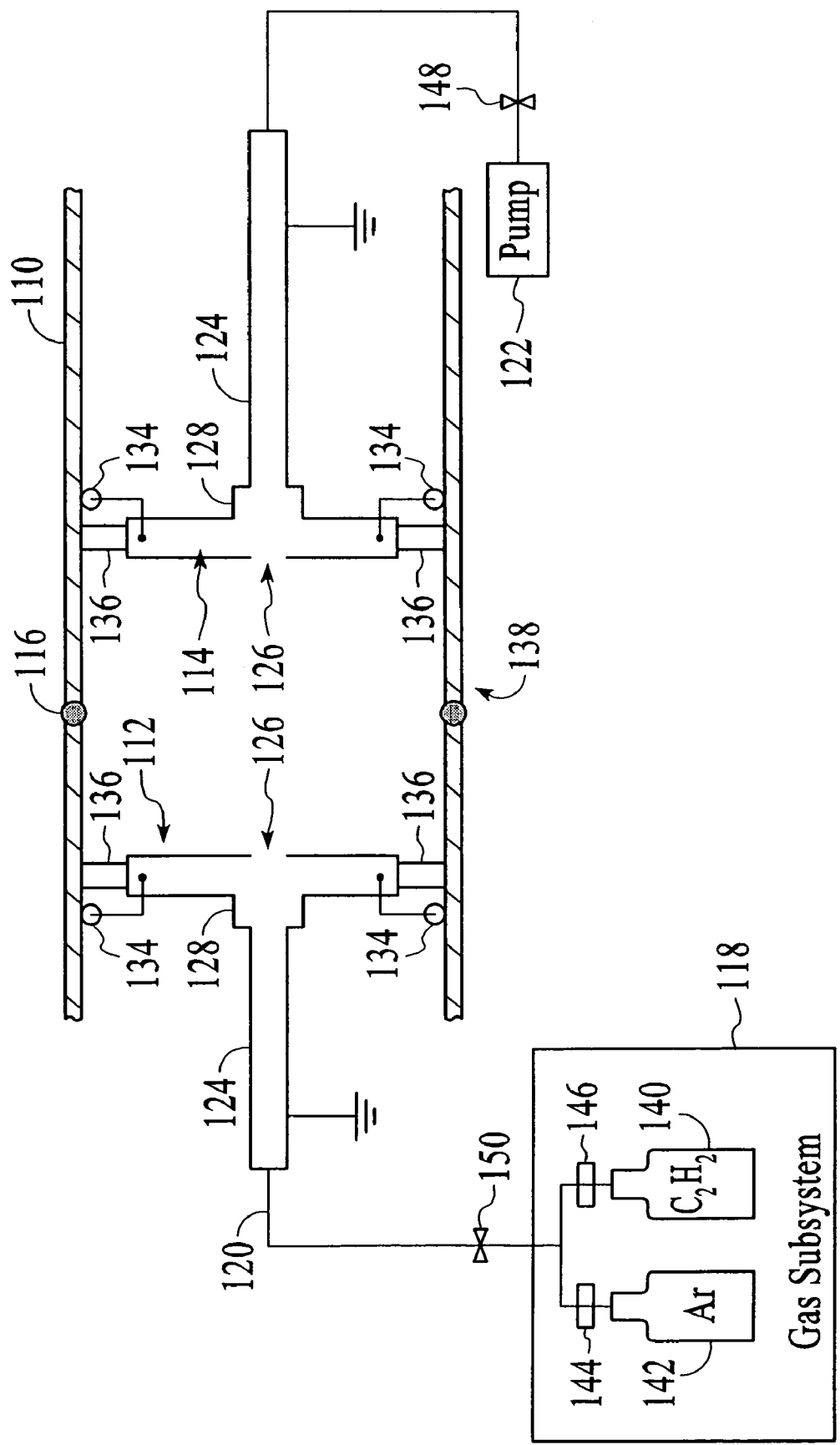
FIG. 2 is a functional view of a second embodiment of a coating apparatus in accordance with the invention.

FIG. 2 shows another possible arrangement. Here, the application of the invention is performed "in the field." A conductive workpiece 110 may be very long in length, for example having a length-to-diameter ratio greater than 50:1. The conductive workpiece may be an assembly of sections welded together to form long lengths of pipe, but may also be a single high aspect ratio piece. Often, sections of pipe, having already been coated and having a uniform coating, are welded together. The welds and the areas surrounding the welds, in which the welding process has compromised the coating, require corrosion-resistant coating.

Conductive structures 112 and 114 are inserted into workpiece openings (not shown) and maneuvered into position at or near weld 116. The conductive structure 112 is coupled to a gas supply subsystem 118 via flexible gas supply line 120. The conductive structure 114 is coupled to a pumping subsystem 122 via flexible pump lines 124. The gas supply and pump lines are connected to openings 126 (FIG. 3) by vacuum-tight fittings 128 by a means known in the art. The gas supply and pump lines are electrically isolated from the conductive structure by an insulator 130, also shown in FIG. 3. A readily available non-toxic carbon-containing gas, such as methane or acetylene, is provided by a first gas supply container 140. This gas is used to form a diamond-like carbon (DLC) coating on the inside of the workpiece 110. Argon (or other sputter gas) is provided from a second gas container 142 to allow a plasma "pre-cleaning" of the pipe surfaces and to allow the PEB processing for forming the interfacial compound that promotes adhesion and corrosion resistance. While not shown, supplies of other gases (e.g., Ge) are available as needed for the deposition of films.

Figure 3:
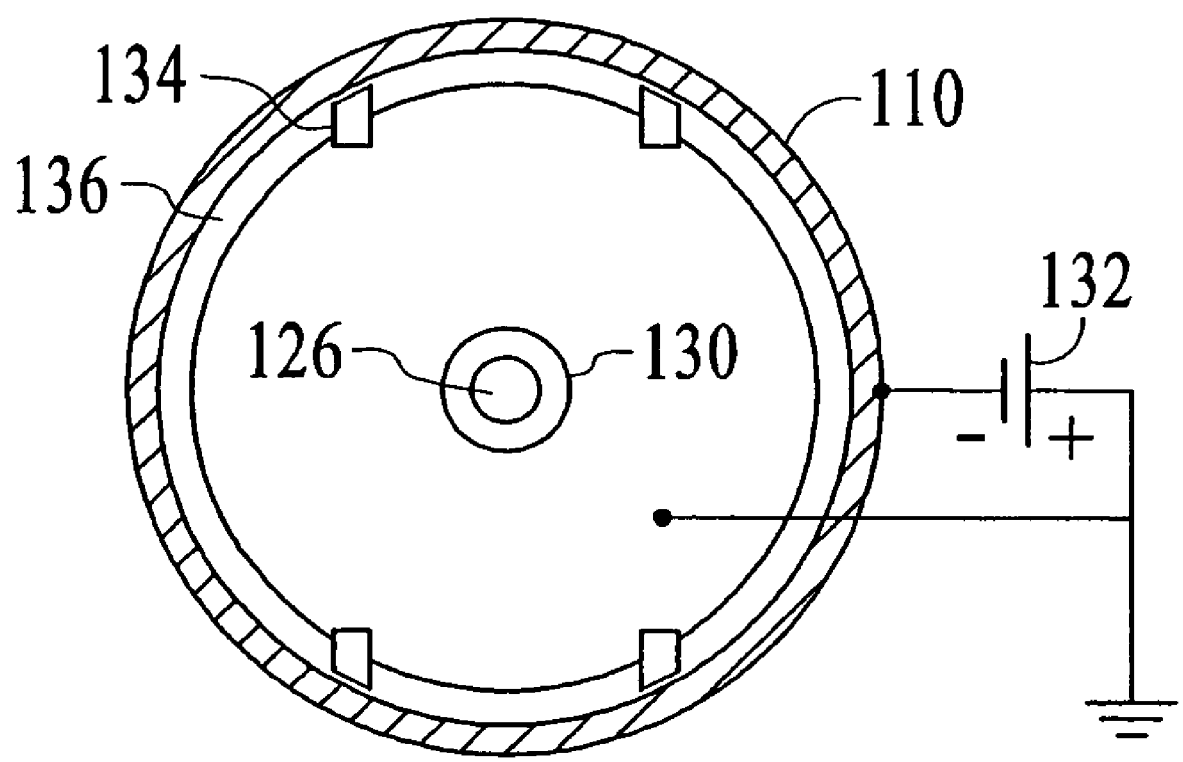
FIG. 3 shows an end view of the workpiece in accordance with the second embodiment of the invention.

The conductive pipe or "workpiece" 110 is connected to a pulsed DC power supply 132, which applies a pulsed negative bias. Here, the workpiece 110 functions as a cathode, while the conductive structures 112 and 114 are connected to the positive side of the pulsed DC supply and biased as anodes. The conductive structures are mounted on insulated rollers 134. A retractable vacuum seal 136, as shown in FIG. 3, surrounds the conductive structures. The vacuum seal, when extended, electrically isolates the conductive structures (anodes) from the pipe and physically isolates a section 138 of pipe to be coated from the remainder of the pipe.

When the vacuum seal 136 is extended, a localized section 138 of the workpiece 110 is isolated from the remainder of the workpiece. The section is pumped to a low pressure by the pumping subsystem 122 and the DC pulsed power supply 132 is used to apply a negative bias to the pipe 110 such that it functions as a cathode. Even though the entire pipe 110 is biased as a cathode, a plasma will only be generated within the interior of the pipe (workpiece section 138) that resides between the conductive structures 112 and 114, because this is the only portion of the pipe interior that is at a low pressure and meets the spacing and pressure requirements for plasma ignition. Also, this section of pipe is the only area exposed to the reactant gases. Therefore, only the internal surfaces of the pipe section will be coated.

As shown in FIG. 2, a precursor gas is introduced through the opening 126 in the conductive structure 112 when the gas inlet valve 150 is opened. Mass flow controllers 144 and 146 control the amount of gas flowing into the workpiece section

138. This gas is ionized into a plasma by the applied voltage. Ions contained in the gas are pulled to the internal surfaces of the workpiece section 138 (cathode) to form a coating. Unused gas and by-products are exhausted away by the pump 122 through an opening 126 in the conductive structure 114. The flow rate of gas out of the workpiece section 138 is controlled by pump throttle valve 148, such that the amount of gas and pressure within the workpiece section can be independently controlled to further optimize the uniformity of the coating.

In the case of a plasma-activated coating process and in particular when a hollow cathode plasma is generated, the plasma density depends on the pressure/diameter ratio. A typical prior art plasma density is a maximum of approximately 1E10 ions/cm$^3$ or about 10% ionization (ionized gas/total gas particles×100). By using a hollow cathode plasma, this technique can achieve plasma densities of up to 1E12 ions/cm$^3$. This provides many advantages, including higher deposition rate, improved film quality, and a thin plasma sheath, such that ion energy is not lost due to collisions across the sheath.

If a Child's law plasma sheath, s, is assumed for a planar diode structure, then: s=0.4714×$L_{De}$(2V/$T_e$), where $L_{De}=\epsilon_0 T_e/en_i$) is the Debye length, $n_i$ is the electron and ion density, $T_e$ is the electron temperature in electron volts, $\epsilon_0$ is the permittivity of free space, e is the charge of an electron or 1.6E-19C, and V is the bias voltage. For a typical plasma density of 1E10 ions/cm$^3$ and $T_e$=3 eV, with an applied bias of 1000V, s (standard density)=0.8 cm. Given the same parameters and a hollow cathode plasma density of 1E12 ions/cm$^3$, s (hollow cathode)=0.08 cm. The mean free path, λ, of $N_2$ at typical PECVD pressure of 100 mTorr is approximately 0.5 cm, so that for a standard density plasma (since λ<s), ions will collide within the sheath and not arrive at the substrate with the full plasma energy, i.e., at approximately the applied bias voltage. But with a hollow cathode plasma, the sheath has fewer collisions. Thus, the hollow cathode technique provides significant advantages for the PECVD process where accurate control of ion energy is required, such as DLC. Control of the pressure is also advantageous throughout the workpiece for these types of processes, due to the effect of pressure on plasma density.

Figure 4:
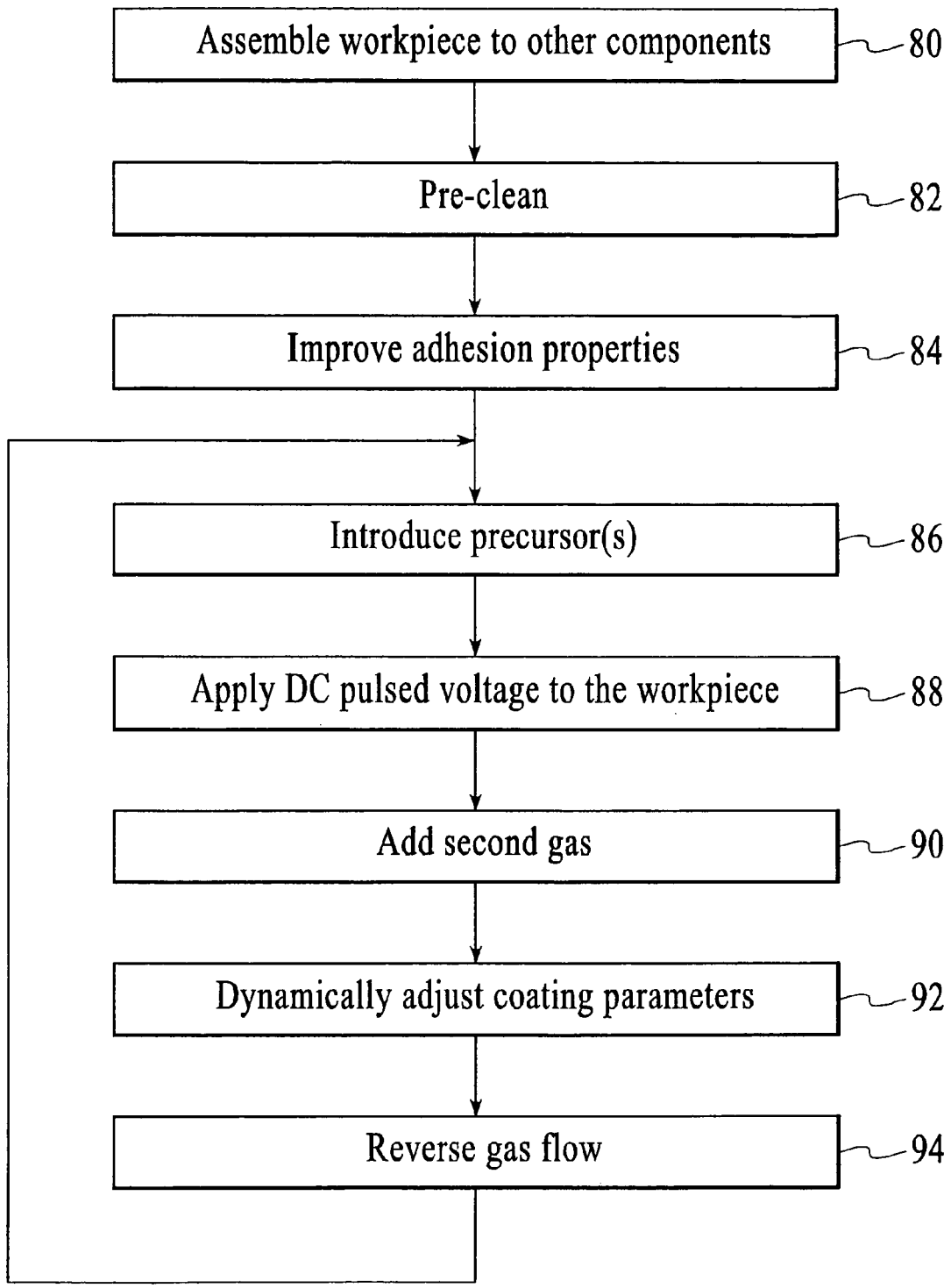
FIG. 4 shows a process flow of steps for implementing the invention.

One embodiment of the process flow in accordance with the invention will be described with reference to FIGS. 2 and 4, but the process is equally applicable to the arrangement of FIG. 1. At step 80, the workpiece 110 is assembled to other components of a tubing system, so that it is not necessary to heat the workpiece following the completion of the interior coating process. Thus, all welding steps involving the workpiece are completed to apply a coating to the interior of the workpiece section 138. As previously noted, the workpiece is shown as an assembly of tubes or parts, but may be a unitary section (as shown in FIG. 1).

At step 82, the conductive structures 112 and 114 are positioned at the first welded section. A pre-cleaning may be an introduction of a sputtering gas, such as argon, from the second gas supply container 142. The pre-cleaning may be initiated after pump down to 1×10$^{-3}$ Torr or, preferentially, below 1×10 Torr. Contaminants on the interior surface of the workpiece are sputtered off when a negative DC pulse is applied via the power supply 132. This pre-cleaning is not critical, but may be advantageous.

At step 84, PEB is performed in order to increase the adhesion properties and, simultaneously, to increase resistance to corrosion. In a preferred embodiment, germanium is the material of primary interest, but other materials are also suitable, including silicon, carbon, and tin. The selection of film material is at least partially based upon the surface on which the film is to be formed. By using PEB, an interfacial compound is formed to provide the target properties. For example, formation of nickel silicide at a nickel/silicon interface or nickel germanicide at a nickel/germanium interface may be formed on a nickel workpiece.

Figure 5:
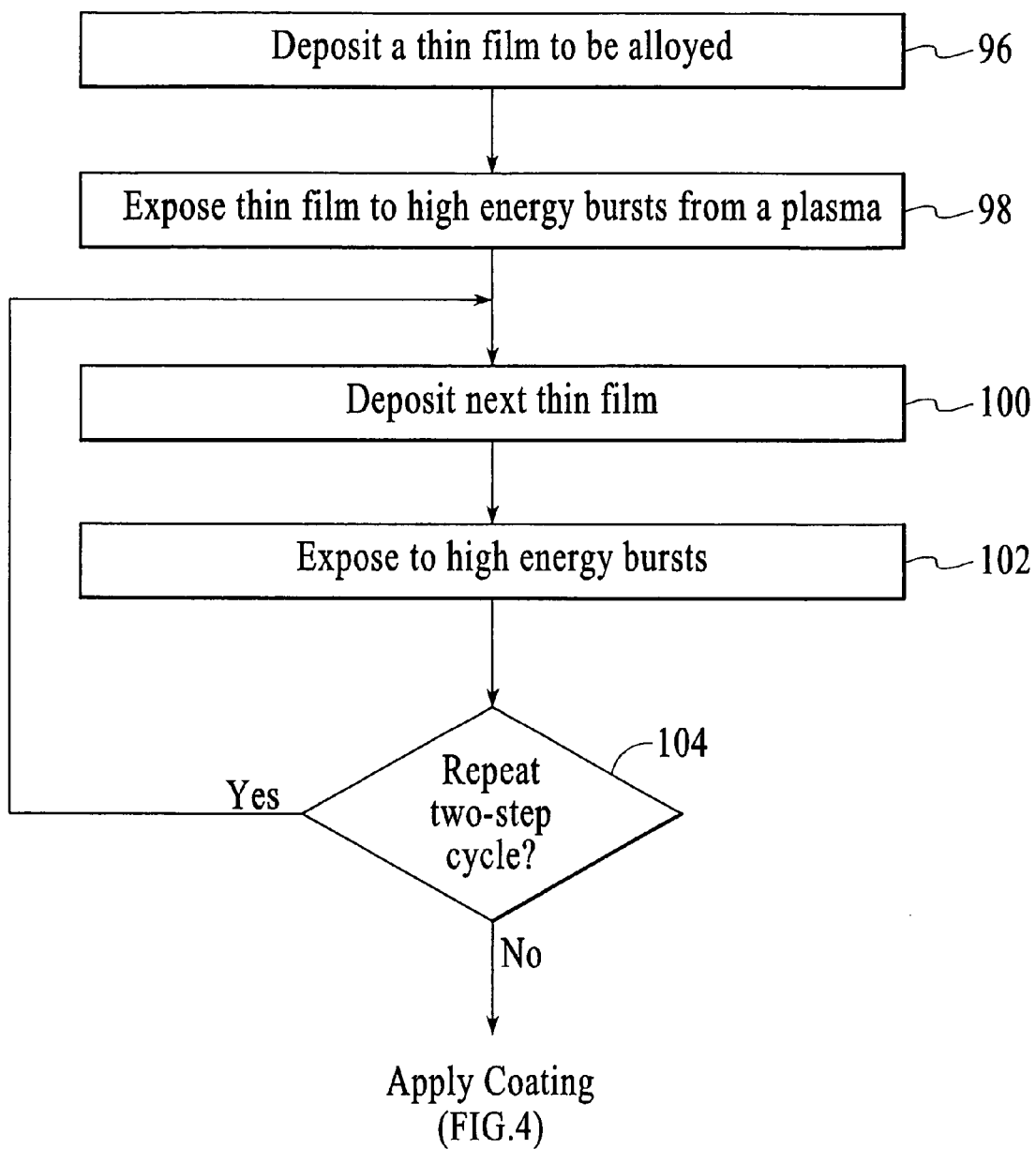
FIG. 5 shows a process flow of sub-steps for implementing step 84 of FIG. 4.

One embodiment of the step 84 is represented in a series of sub-steps in FIG. 5. A thin film is deposited in sub-step 96. The thickness of the film may be in the range of 0.2 nm to 20 nm. Then, in sub-step 98, the thin film is exposed to high energy bursts from a plasma. The preferred plasma is an argon plasma, but this is not critical. The film is exposed to high energy bursts from the plasma, such as 10 kW bursts provided by a pulsed DC discharge arrangement. Particularly in this first execution of the deposit-and-expose cycle, the alloying may reach the material of the workpiece, rather than being limited to affecting the deposited film. The high energy argon plasma simultaneously provides energy for new bond formation and provides a limited degree of etch back.

The resulting interfacial compound is comprised of the constituents of the workpiece 110 in combination with the constituents of the thin deposited layer. These constituents are combined using plasma exposure with sufficiently high energy flux (voltage and power) to provide the activation energy for the thin deposited layer to react, thereby bonding with the substrate. For example, if workpiece "A" is comprised of constituents A1, A2, . . . An, and the thin deposited "B" layer is comprised of B1, B2, . . . Bn, then the interfacial compound can be formed by the combination of A1, A2, . . . An and B1, B2, . . . Bn. As one instance:

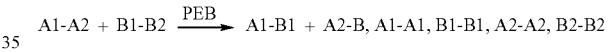

The available combinations will depend upon the tendency for inter-diffusion and bonding under PEB conditions. As another factor in determining the constituents of the reacted "B" layer, species from the gas phase may diffuse into the thin "B" layer. As examples, hydrogen may be intentionally introduced and oxygen may be intentionally or unintentionally introduced during formation of the compound.

Sub-steps 100 and 102 repeat the cycle of depositing a thin film and exposing the deposited film to high energy bursts. Although some etch back will occur, the repeat of the cycle will add to the total thickness. That is, the deposition of material at sub-step 100 exceeds the etch back that occurs at sub-step 102.

Decision sub-step 104 is a determination of whether additional material (e.g., Ge) is to be added. If affirmative, the cycle is repeated. Preferably, the cycle of depositing a film and then providing bombardment of the film using an argon plasma is repeated five to fifty times. Within each of these cycles, the deposition is much shorter than the bombardment sub-step. For example, the deposition of a particular germanium film at sub-step 100 may occur within five seconds, while the argon bombardment that follows (sub-step 102) is executed as thousands of high energy bursts over a ten-minute time period. By repeating PEB for five to fifty times, the different deposited films are blended into the interfacial workpiece region with an increased number of participating bonds. Moreover, the bonding interface is increased in thickness, thus reducing stress concentration. PEB can be used for many additional material combinations. The PEB process can be monitored using the voltage/current and waveform characteristics available via a conventional plasma power supply.

Figure 6:
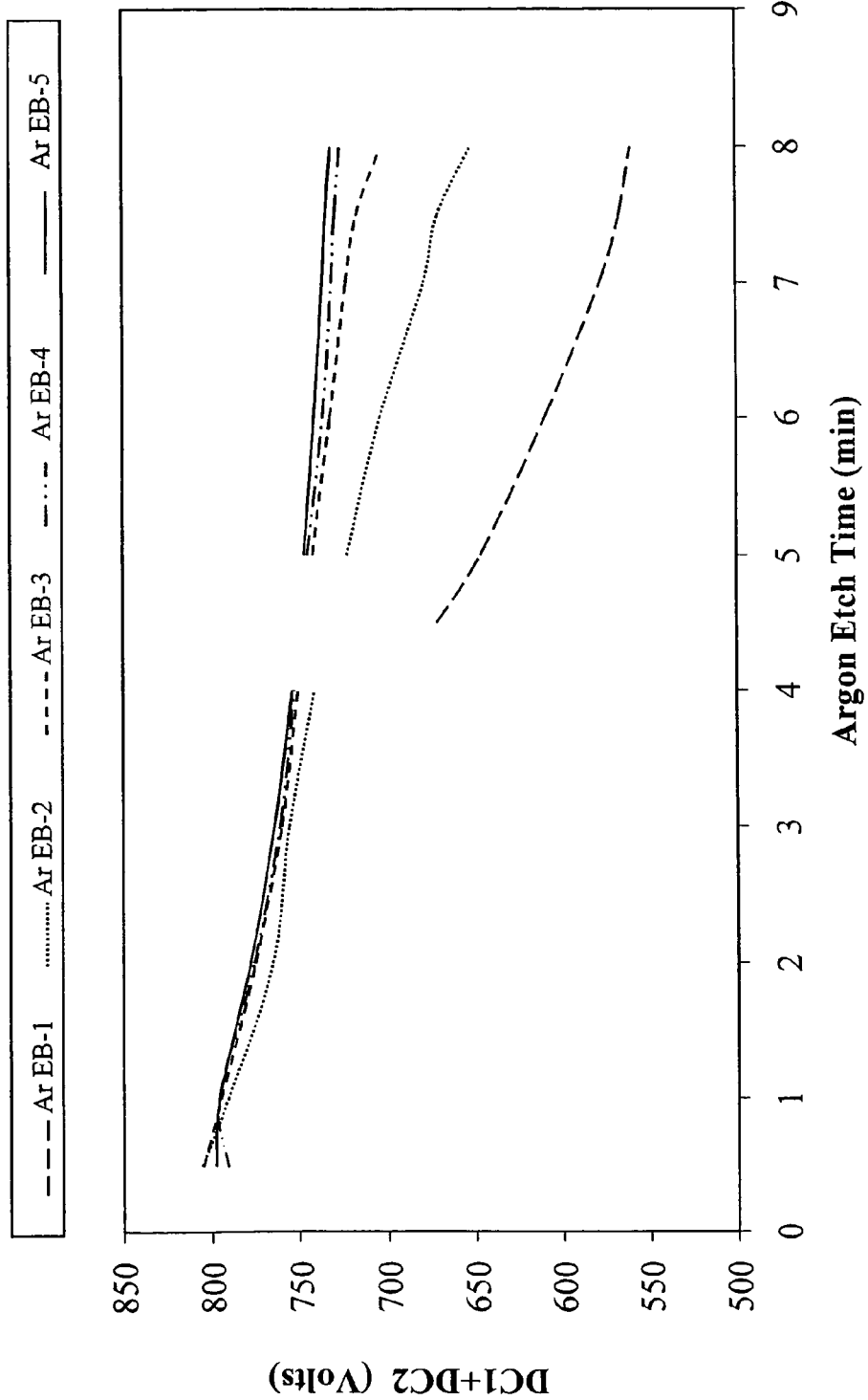
FIG. 6 is a graph of test results from using GeC as an interfacial layer.

When a negative response occurs at decision sub-step 104, formation of the interfacial layer is complete. FIG. 6 is a graph of test results of the sub-steps of FIG. 5 in which the deposition sub-steps 96 and 100 employed Ge(CH$_3$)$_4$ or GeMe$_4$ as the gas, while the five etch back sub-steps 98 and 102 utilizing argon gas (Ar EB-n). Deposition occurred over a period of five seconds, with a six second stabilization. In comparison, the etch back occurred over an eight minute time period. During the deposition, process parameters included providing an internal pressure of 150 mT, with 9 sccm GeMe$_4$ and 400 sccm Ar. During the argon etch back, process parameters included an internal pressure of 65 mT with 100 sccm Ar.

In accordance with FIG. 6, the interfacial layer is formed by first introducing germanium so as to promote adhesion to the workpiece. In the experimentation, the workpiece was a stainless steel substrate (with the nickel plating having a thickness of 100 μm to 1.5 μm. Then, a silicon source was connected with the germanium source. Possible precursors include SiH$_4$ and Si(CH$_3$)$_4$ for the silicon source and GeH$_4$ and Ge(CH$_3$)$_4$ for the germanium source. The preferred source is tetramethylgermanium.

Optionally, the formation of the interfacial layer may be followed by formation of one or more blend layers. For example, C$_2$H$_2$ may be introduced at a low level as compared to a silicon source and a germanium source. In a preferred embodiment, a sequence of blend layers is provided with increasing C$_2$H$_2$ and decreasing silicon concentrations.

Then, the final layer may be formed. Returning to FIGS. 2 and 4, at least one precursor may be introduced into the workpiece section 138 at step 86. By way of example, but not limitation, precursors include methane, acetylene or toluene, or other similar hydrocarbons. The application of a DC pulsed voltage is represented by step 88 in FIG. 4. During the coating step, argon may be mixed with the carbon-containing precursors, as indicated at step 90.

In step 92, the coating parameters are dynamically adjusted during the coating process. Probes provide information that can be used by the computer software control 162 and the pressure controller 160 to maintain various parameters within their ranges of tolerance. Thus, the factors that determine pressure within the workpiece section 138 can be adjusted as needed or the magnitude and duty cycle of the pulsed bias may be adjusted, if necessary.

Upon completion of the first duty cycle, reverse flow cycling is implemented in step 94, but this step is not required. Process flow steps 80-94 may be repeated to ensure that the internal surfaces of the workpiece sections 138 of different diameters and lengths are coated uniformly. After the completion of the coating process, the conductive structures are repositioned at the next section.

In principle, any metal, ceramic or DLC coating can be applied in a laboratory that has the desired properties of hardness and corrosion resistance (e.g., TiN, CrN, etc.). However, for coatings applied in the field, preferably a non-toxic or low toxicity precursor is employed. A DLC precursor such as methane, acetylene or toluene is used as the source gas in the preferred embodiment. DLC has been shown to provide a hard, corrosion resistant, and low friction coating. Properties of this film can be tailored by adjusting the sp3 (diamond), sp2 (graphite) and sp1 (linear) bonding hybridization ratios in the film. Hydrogen content will also affect the film properties. Typically, the highest sp3 ratio (most diamond-like) is obtained by methane, but this also produces a lower deposition rate compared to higher carbon molecules and also higher compressive stress, limiting film thickness to 5000 Å. Acetylene can also provide high sp3 content with a higher deposition rate compared to methane but the bias voltage should be increased to compensate for the larger molecule size. Additives (e.g., silicon or silicon oxide) in the DLC matrix can improve thermal stability and can reduce compressive stress. An organic-based precursor, such as tetramethyl silane, Si(CH$_3$)$_4$, or hexemethyldisolxane, C$_6$H$_{18}$Si$_2$O, can be mixed with the hydrocarbon precursor(s) to introduce these dopants.

Film properties can thus be tailored by selection of the precursor gas, or layered films can be deposited. For example, if it is necessary for deposited films to cover a rough surface (e.g., welds) with a thick deposited coating, the above process can be modified by deposition of a thin methane-based layer, followed by the use of a higher deposition rate, lower stress precursors such as toluene, or by higher energy ion bombardment to increase adhesion and reduce stress. The trade-offs of desired mechanical, electrical or optical film properties and deposition rate and stress for given precursors and bonding hybridizations can be optimized for a given process.

The process can be varied for different applications. In the formation of the final layer (i.e., cap layer), pure DLC using a C$_2$H$_2$ source may be provided, but optionally germanium may be added. For the interfacial/adhesion layer, a higher germanium concentration may be used (including 100% germanium) if the workpiece is to be employed in extremely corrosive environments, such as for certain applications in the oil industry. On the other hand, for the best adhesion to stainless steel, a lower concentration of germanium compared to silicon should be used.

Figure 7:
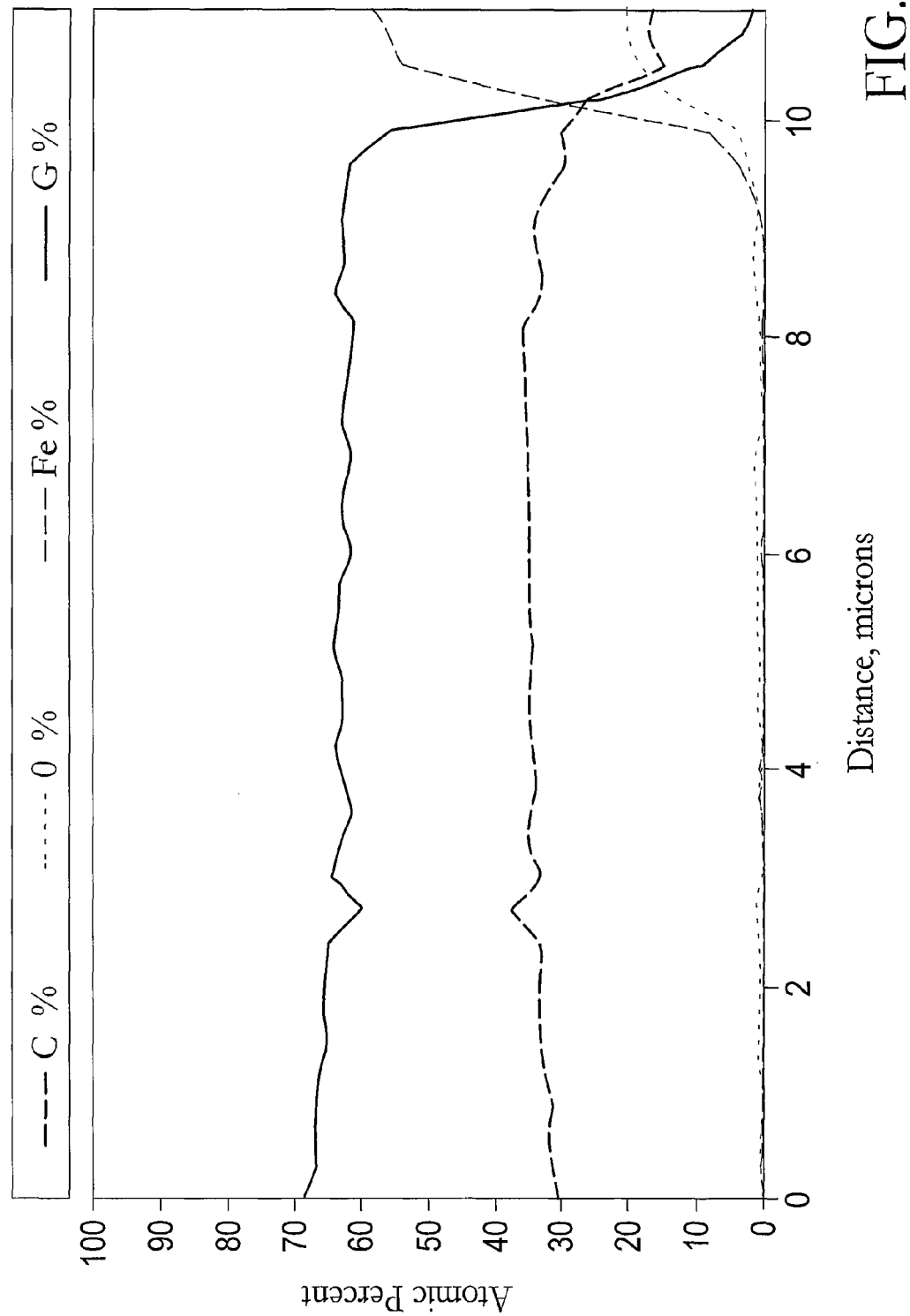
FIGS. 7 and 8 are Auger profiles of pipes, showing the differences in uses of silicon and germanium.
Figure 8:
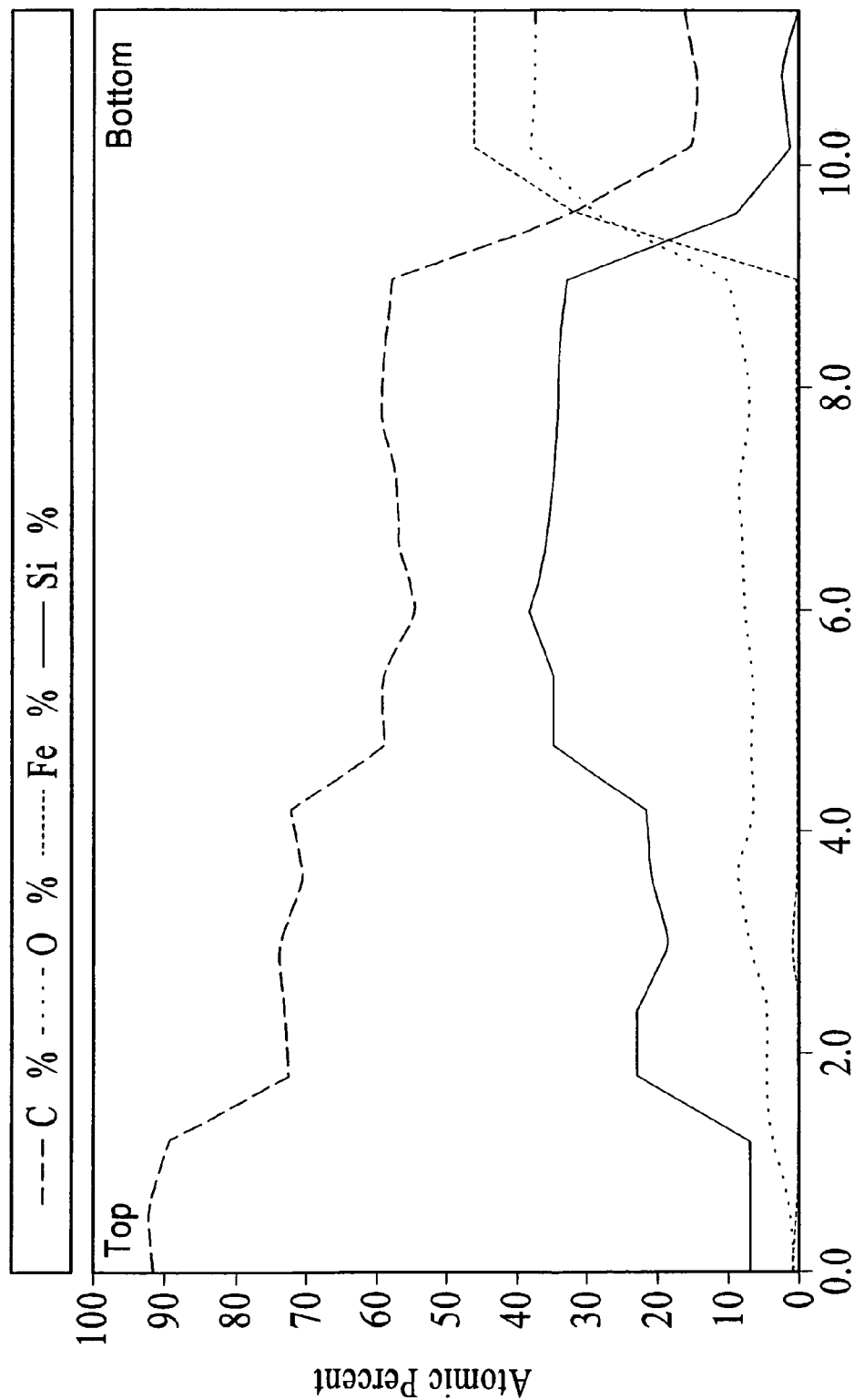

While other materials have been described as being suitable for implementing the present invention, it has been determined that Group IV compounds, by way of example and not by limitation, Ge and germanium carbide are employed for a preferred embodiment. These materials can prevent chemical undercut in the vicinity of defects on rough metal substrates, particularly where the under layer contains silicon or silicon is deposited from silane or tetramethylsilane. Ge and/or GeC may also be used to reduce porosity of the DLC coating. Additionally, Ge or GeC may be used as the cap layer atop the DLC coating. That is, the materials may be used before the formation of the DLC coating, during the formation of the DLC coating, or following the formation of the DLC coating. Using Ge, GeC, or a Ge-doped DLC top layer reduces the susceptibility of the added coatings to chemical penetration from the top. Additionally, the materials improve the composition and material property uniformity along the length of a workpiece, such as a pipe. Table 1 shows the differences in coating material uniformity from the gas entry to the gas exit for uses of Si and Ge. Also, the ratio of germanium/carbon incorporated in the film is much higher for tetramethyl-germanium compared to the ratio of silicon/carbon incorporated using tetramethylsilane (as can be seen by comparing the two Auger profiles of FIG. 7 (Ge) and FIG. 8 (Si). Using a Ge or GeC precursor reduces the stress and increases the thickness of the DLC coating.

TABLE 1

| Sample Location | % C | % Si | % Ge | C/Si | C/Ge |
|---|---|---|---|---|---|
| Si Entry | 57.9 | 39.2 | 0 | 1.477041 | |
| Si Exit | 77 | 16.9 | 0 | 4.556213 | |
| Ge entry | 35 | 0 | 63 | | 0.555556 |
| Ge Exit | 36 | 0 | 61 | | 0.590164 |

Data shows that the present invention significantly reduces susceptibility of chemical attack on exposure to HCl, NaCl, H$_2$SO$_4$, sour autoclave, or other corrosive environments. The reduction is most significant with regard to undercut attack, where undercutting is defined as cutting through a coating so as to expose adjacent layers or the substrate to attack.

What is claimed is:

1. A method of coating an interior surface of a workpiece comprising:
   connecting a biasing system such that said workpiece functions as an electrode;
   controlling pressure within an interior of said workpiece such that a cooperation between said biasing system and said pressure establishes a hollow cathode effect within said interior;
   forming a uniform, adhesion-promoting, corrosion-resistance layer on said interior surface, including repetitive cycling of deposition and exposure steps, wherein each deposition step includes introducing a germanium-containing precursor within said interior so as to deposit a portion of the uniform, adhesion-promoting, corrosion-resistance layer, and wherein each exposure step includes exposing said uniform, adhesion-promoting, corrosion-resistance layer to high energy bursts from a plasma that provides activation energy to form an interfacial compound, deposition of the uniform, adhesion-promoting, corrosion-resistance layer from each deposition step exceeding etchback from each exposure step;
   forming a sequence of blend layers on the adhesion-promoting corrosion-resistance layer using an increasing relative concentration of hydrocarbon precursors for successive blend layers; and
   forming a second layer on said blend layers, said second layer being a layer of diamond-like carbon (DLC), including utilizing a high intensity plasma available as a consequence of said hollow cathode effect during formation of said corrosion-resistance layer and said second layer.

2. The method of claim 1 further comprising forming a cap layer following said formation of said layer of DLC, including utilizing said hollow cathode effect in formation of said cap layer and including introducing germanium into said cap layer.

3. The method of claim 1 wherein said workpiece is metallic and said corrosion-resistance layer is formed directly on said workpiece.

4. The method of claim 3 wherein connecting said biasing system includes applying a pulsed DC voltage to said workpiece.

5. The method of claim 1 wherein introducing said germanium-containing precursor includes providing a flow of tetramethylgermane, such that said corrosion-resistance layer includes germanium carbide.

6. The method of claim 1 wherein introducing said germanium-containing precursor includes providing a flow of germane ($GeH_4$), such that said corrosion-resistance layer includes germanium and hydrogen.

7. The method of claim 1 wherein forming said corrosion-resistance layer further includes depositing one of silicon and silicon carbide.

8. The method of claim 1 wherein forming said corrosion-resistance and second layers include using Plasma Enhanced Chemical Vapor Deposition (PECVD) techniques.

9. A method of coating an interior surface of a workpiece comprising:
   establishing an environment within an interior of said workpiece such that formation of layers is by means of Plasma Enhanced Chemical Vapor Deposition (PECVD) utilizing hollow cathode effects, said workpiece being metallic and being biased to function as an electrode;
   depositing a uniform, adhesion promoting, corrosion-resistance first layer directly on said interior surface, including cycling between (1) a deposition step introducing a germanium-containing precursor into said environment so as to deposit a portion of said first layer and (2) a step of exposing said first layer to high energy bursts from a plasma that provides activation energy to form an interfacial compound, deposition of the first layer from each cycle of said deposition step exceeding etchback from each cycle of said exposure step;
   depositing a sequence of blend layers on the adhesion-promoting corrosion-resistance layer using an increasing relative concentration of hydrocarbon precursors for successive blend layers;
   depositing a diamond-like carbon (DLC) layer on said blend layers; and
   depositing a cap layer on said DLC layer, including introducing a germanium-containing gas into said environment.

10. The method of claim 9 wherein establishing said environment within said interior includes biasing said workpiece using a pulsed DC input and further includes establishing a pressure that is based upon factors which include a diameter of said interior.

11. The method of claim 9 wherein each of introducing said germanium-containing precursor and introducing said germanium-containing gas includes using one of tetramethylgermane and germane.

12. The method of claim 9 wherein said blend layers having decreasing concentrations of silicon within said sequence.

13. The method of claim 9 wherein depositing said first layer includes connecting a source of silicon-containing gas to said interior simultaneously with said germanium-containing precursor.

14. The method of claim 9 wherein depositing said DLC layer includes introducing germanium gas into said interior of said workpiece, such that germanium is introduced into said interior during deposition of each of said first layer, said DLC layer and said cap layer.

* * * * *